United States Patent
Asakawa et al.

(10) Patent No.: US 11,378,885 B2
(45) Date of Patent: Jul. 5, 2022

(54) PATTERN FORMATION MATERIAL AND PATTERN FORMATION METHOD

(71) Applicant: KIOXIA CORPORATION, Tokyo (JP)

(72) Inventors: Koji Asakawa, Kawasaki Kanagawa (JP); Naoko Kihara, Matsudo Chiba (JP); Seekei Lee, Kawasaki Kanagawa (JP); Norikatsu Sasao, Kawasaki Kanagawa (JP); Tomoaki Sawabe, Taito Tokyo (JP); Shinobu Sugimura, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 173 days.

(21) Appl. No.: 15/919,443

(22) Filed: Mar. 13, 2018

(65) Prior Publication Data

US 2019/0086805 A1 Mar. 21, 2019

(30) Foreign Application Priority Data

Sep. 19, 2017 (JP) .............................. JP2017-179536

(51) Int. Cl.
| | |
|---|---|
| G03F 7/26 | (2006.01) |
| G03F 7/031 | (2006.01) |
| G03F 7/40 | (2006.01) |
| G03F 7/038 | (2006.01) |
| G03F 7/027 | (2006.01) |
| G03F 7/00 | (2006.01) |

(52) U.S. Cl.
CPC ............ *G03F 7/265* (2013.01); *G03F 7/0002* (2013.01); *G03F 7/027* (2013.01); *G03F 7/031* (2013.01); *G03F 7/0384* (2013.01); *G03F 7/40* (2013.01)

(58) Field of Classification Search
CPC ..... G03F 7/30; G03F 7/38; G03F 7/40; G03F 7/0002; G03F 7/36; G03F 7/031; G03F 7/265

USPC ................................ 264/496; 430/281.1, 324
See application file for complete search history.

(56) References Cited

U.S. PATENT DOCUMENTS

| | | | |
|---|---|---|---|
| 7,704,425 B2 | 4/2010 | Heidari et al. | |
| 7,854,873 B2 | 12/2010 | Heidari et al. | |
| 8,288,079 B2 * | 10/2012 | Ogino | B82Y 40/00 430/281.1 |
| 9,169,412 B2 | 10/2015 | Amao | |
| 2007/0267764 A1 * | 11/2007 | Morimoto | G03F 7/0002 430/319 |
| 2009/0011141 A1 * | 1/2009 | Carter | B82Y 40/00 427/534 |
| 2011/0200761 A1 * | 8/2011 | Kusu | G03F 7/0002 427/532 |
| 2013/0120485 A1 * | 5/2013 | Kodama | B41J 2/04543 347/14 |
| 2017/0009062 A1 * | 1/2017 | Kimura | C01G 25/02 |

FOREIGN PATENT DOCUMENTS

| | | |
|---|---|---|
| JP | 2013-233807 A | 11/2013 |
| WO | WO 2014/041940 A1 | 3/2014 |

* cited by examiner

*Primary Examiner* — John S Chu
(74) *Attorney, Agent, or Firm* — Finnegan, Henderson, Farabow, Garrett & Dunner L.L.P.

(57) ABSTRACT

According to one embodiment, a pattern formation material includes a first monomer. The first monomer includes a first molecular chain, a first group, and a second group. The first molecular chain includes a first end and a second end. The first group has an ester bond to the first end. The second group has an ester bond to the second end. The first group is one of acrylic acid or methacrylic acid. The second group is one of acrylic acid or methacrylic acid. The first molecular chain includes a plurality of first elements bonded in a straight chain configuration. The first elements are one of carbon or oxygen. The number of first elements is 6 or more. A film including the first monomer is caused to absorb a metal compound including a metallic element.

17 Claims, 5 Drawing Sheets

FIG. 3A PTTA
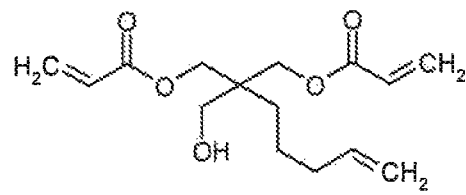
FIG. 3B GLPOTA
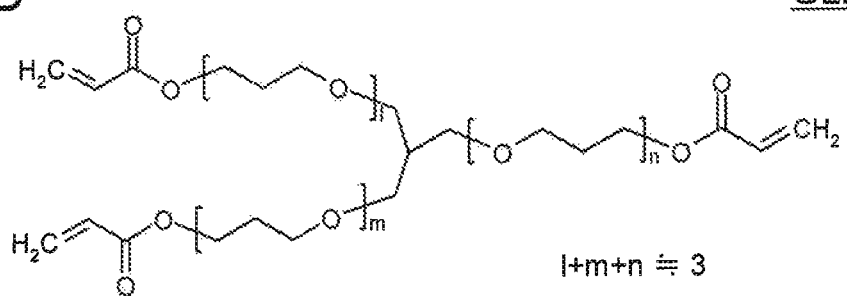
FIG. 3C GDD
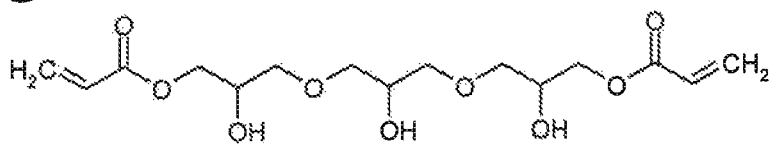
FIG. 3D NDDA
FIG. 3E TPGDA
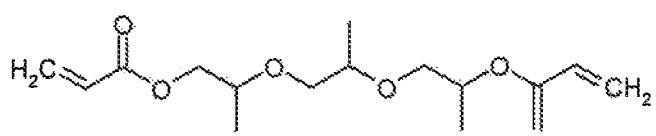

HPNDA

BP-4EAL m+n ≅ 4

BP-4PA m+n ≅ 4

70PA

TMP3OTA

MA

PATTERN FORMATION MATERIAL AND PATTERN FORMATION METHOD

CROSS-REFERENCE TO RELATED APPLICATIONS

This application is based upon and claims the benefit of priority from Japanese Patent Application No. 2017-179536, filed on Sep. 19, 2017; the entire contents of which are incorporated herein by reference.

FIELD

Embodiments described herein relate generally to a pattern formation material and a pattern formation method.

BACKGROUND

For example, a pattern formation material is used in a pattern formation method such as nanoimprint lithography, etc. It is desirable to increase the productivity for the pattern formation material and the pattern formation method.

BRIEF DESCRIPTION OF THE DRAWINGS

FIG. 3A to FIG. 3E are schematic views illustrating the pattern formation materials;

DETAILED DESCRIPTION

Figure 1A:
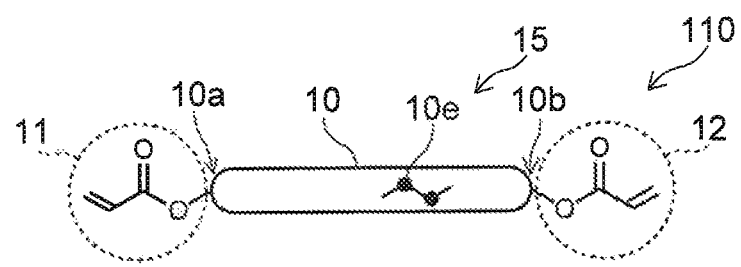
FIG. 1A and FIG. 1B are schematic views illustrating a pattern formation material according to a first embodiment.

According to one embodiment, a pattern formation material includes a first monomer. The first monomer includes a first molecular chain, a first group, and a second group. The first molecular chain includes a first end and a second end. The first group has an ester bond to the first end. The second group has an ester bond to the second end. The first group is one of acrylic acid or methacrylic acid. The second group is one of acrylic acid or methacrylic acid. The first molecular chain includes a plurality of first elements bonded in a straight chain configuration. The first elements are one of carbon or oxygen. The number of the first elements is 6 or more. A film including the first monomer is caused to absorb a metal compound including a metallic element.

According to another embodiment, a pattern formation method is disclosed. The method can include a film formation process of forming, on a substrate, a pattern formation material film including a pattern formation material. The method can include an absorption process of causing the pattern formation material film to absorb a metal compound including a metallic element. The pattern formation material includes a first monomer. The first monomer includes a first molecular chain, a first group, and a second group. The first molecular chain includes a first end and a second end. The first group has an ester bond to the first end. The second group has an ester bond to the second end. The first group is one of acrylic acid or methacrylic acid. The second group is one of acrylic acid or methacrylic acid. The first molecular chain includes a plurality of first elements bonded in a straight chain configuration. The first elements are one of carbon or oxygen. The number of the first elements is 6 or more.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
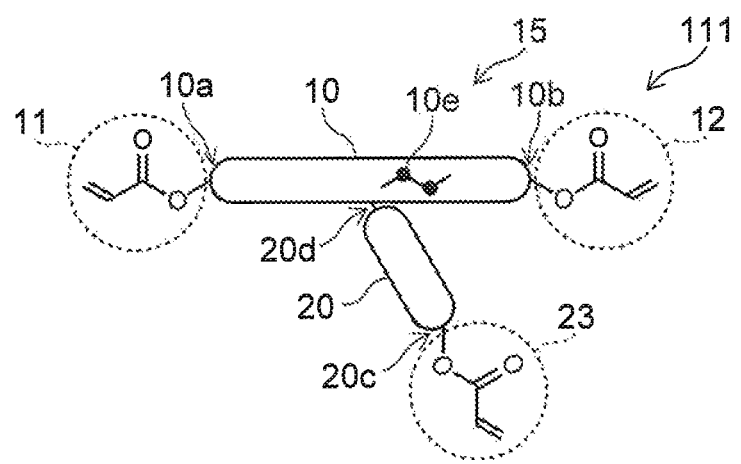

FIG. 1A and FIG. 1B are schematic views illustrating a pattern formation material according to a first embodiment.

As shown in FIG. 1A, the pattern formation material 110 includes a first monomer 15. The pattern formation material 110 may include other materials (e.g., other monomers, photosensitive agents, etc.) other than the first monomer 15.

The first monomer 15 includes a first molecular chain 10, a first group 11, and a second group 12. The first molecular chain 10 includes a first end 10a and a second end 10b. The first group 11 has an ester bond to the first end 10a. The second group 12 has an ester bond to the second end 10b. The first group 11 is one of acrylic acid or methacrylic acid. The second group 12 is one of acrylic acid or methacrylic acid.

The first molecular chain 10 includes multiple first elements 10e. For example, the multiple first elements 10e are bonded in a straight chain configuration. For example, the multiple first elements 10e are arranged along the direction from the first end 10a toward the second end 10b. The multiple first elements 10e are one of carbon or oxygen. In the embodiment, the number of the multiple first elements 10e is 6 or more. The number of the multiple first elements 10e is the number of the one of carbon or oxygen arranged in the straight chain configuration. The first molecular chain 10 may include groups at branches. In such a case, the number of the elements included in the branches is not included in the "number of the multiple first elements 10e." The groups at the branches include, for example, an alkyl group, a hydroxyl group, a hydroxide group, a carbonyl group, an amino group, etc.

Thereby, as described below, a high etching resistance is obtained after the film including the first monomer 15 absorbs a metal compound including a metallic element. Thereby, a pattern formation material and a pattern formation method can be provided in which it is possible to increase the productivity.

In a pattern formation material 111 as shown in FIG. 1B, the first monomer 15 may further include a second molecular chain 20 and a third group 23 in addition to the first molecular chain 10, the first group 11, and the second group 12 recited above. The second molecular chain 20 includes a third end 20c and a fourth end 20d. The third group 23 has an ester bond to the third end 20c. The third group 23 is one of acrylic acid or methacrylic acid. The fourth end 20d is bonded to the first molecular chain 10.

Thus, other than the first molecular chain 10, the second molecular chain 20 may be provided in the first monomer 15. Even in such a case, the number of the multiple first elements 10e included in the first molecular chain 10 is 6 or more.

In the pattern formation material 111, the second molecular chain 20 and the section of the first molecular chain 10 between the first end 10a and the bonding point between the first molecular chain 10 and the second molecular chain 20 also can be considered to be one molecular chain. In such a case, the first molecular chain 10 between the second end 10b and the bonding point between the first molecular chain 10 and the second molecular chain 20 corresponds to another molecular chain. When considered as such, the number of the multiple first elements 10e may be 6 or more in the set of the second molecular chain 20 and the section of the first molecular chain 10 between the first end 10a and the bonding point between the first molecular chain 10 and the second molecular chain 20 (the one molecular chain).

Examples of the characteristics of such materials (the pattern formation materials 110, 111, etc.) are described below.

Second Embodiment

A second embodiment is related to a pattern formation method. The embodiment is an example of a pattern formation method using the pattern formation materials (the pattern formation materials 110, 111, etc.) according to the first embodiment. An example will now be described in which the pattern formation material 110 is used. The method described below also is applicable in the case where the pattern formation material 111 is used.

FIG. 2A to FIG. 2F are schematic cross-sectional views illustrating the pattern formation method according to the second embodiment.

Figure 2A:
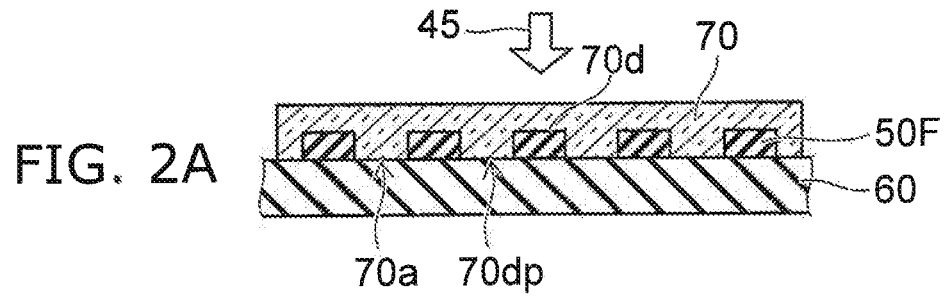
FIG. 2A to FIG. 2F are schematic cross-sectional views illustrating the pattern formation method according to the second embodiment.
Figure 2B:
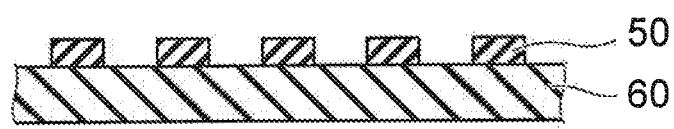

As shown in FIG. 2A and FIG. 2B, a pattern formation material film 50 that includes the pattern formation material 110 is formed on the surface of a substrate 60. In the example, the pattern formation material film 50 is formed by nanoimprint lithography.

For example, a template 70 that has a surface 70a including a resist pattern 70dp is prepared as shown in FIG. 2A. A film 50F that includes the pattern formation material 110 is positioned between the surface 70a and the substrate 60. Then, the film 50F is solidified. In the example, light (e.g., ultraviolet) is irradiated on the film 50F in the process of curing. In such a case, the pattern formation material 110 is photosensitive. For example, the first monomer 15 is polymerized; and a solid is obtained from the pattern formation material 110. Or, heating of the film 50F may be performed in the process of curing. By the curing process, the pattern formation material film 50 is obtained from the film 50F positioned at a recess 70d of the resist pattern 70dp. The template 70 and the pattern formation material film 50 are separated (referring to FIG. 2B).

Thus, the pattern formation method according to the embodiment includes a film formation process of forming, on the substrate 60, the pattern formation material film 50 including the pattern formation material 110.

Figure 2C:
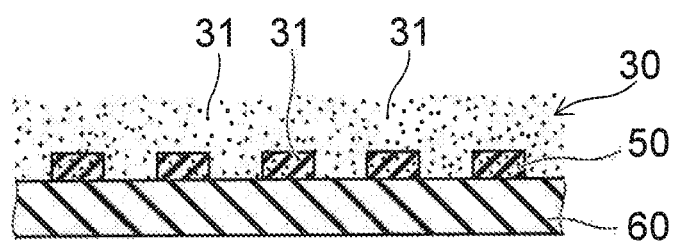

As shown in FIG. 2C, the pattern formation material film 50 is caused to absorb an organometal compound 30 including a metallic element 31.

The organometal compound 30 includes, for example, an organic metal compound. The organometal compound 30 includes, for example, trimethyl aluminum (TMA). The organometal compound 30 may include, for example, chlorine and at least one selected from the group consisting of Ti, V, and W. The organometal compound 30 may include, for example, at least one selected from the group consisting of $TiCl_4$, $VCl_4$, and $WCl_6$.

The metal compound 30 is, for example, a liquid or a gas.

Thus, in the absorption process, the pattern formation material film 50 is caused to absorb the organometal compound 30 including the metallic element 31. In the absorption process, for example, the metal compound 30 is, for example, impregnated inside the pattern formation material film 50. Thus, the absorption process includes the introduction of the organometal compound 30 into the pattern formation material film 50.

For example, the absorption process includes causing the pattern formation material film 50 to absorb at least one of a liquid including the organometal compound 30 or a gas including the metal compound 30. Thereby, for example, the metallic element 31 that is included in the organometal compound 30 is bonded to the material included in the pattern formation material film 50.

Figure 2D:
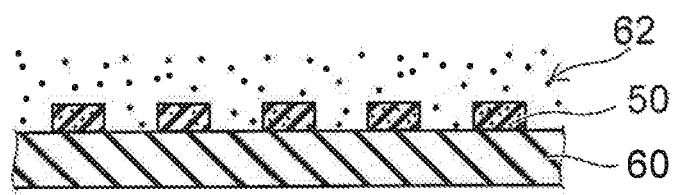

As shown in FIG. 2D, after the absorption process recited above, the pattern formation material film 50 is processed in an atmosphere 62 including at least one selected from the group consisting of water, oxygen, and ozone. This processing includes heating. The temperature of the heating is, for example, not less than 50° C. and not more than 180° C. For example, oxidization is performed in the process.

Figure 2E:
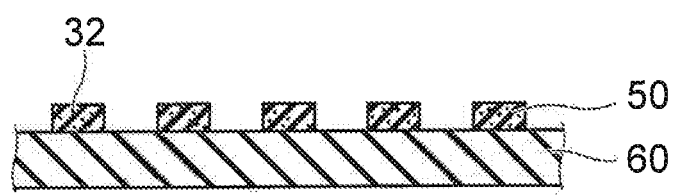

As shown in FIG. 2E, after the process, the pattern formation material film 50 includes, for example, an oxide 32 including the metallic element 31. For example, an oxide 32 that includes aluminum is formed in the case where the organometal compound 30 includes trimethyl aluminum. For example, an oxide 32 that includes titanium is formed in the case where the organometal compound 30 includes $TiCl_4$. For example, an oxide 32 that includes vanadium is formed in the case where the organometal compound 30 includes $VCl_4$. For example, an oxide 32 that includes tungsten is formed in the case where the organometal compound 30 includes $WCl_6$. For example, "metalization" is performed.

The etching resistance of the pattern formation material film 50 is improved by forming the oxide 32 in the pattern formation material film 50. For example, the etching rate of dry etching using a gas including chlorine is lower.

Figure 2F:
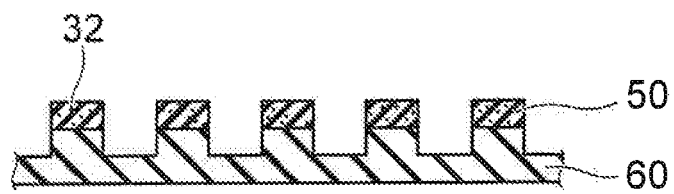

As shown in FIG. 2F, after the process (the oxidation treatment process) recited above, at least a portion of the region of the substrate 60 not covered with the pattern formation material film 50 is removed. For example, etching is performed by using the pattern formation material film 50 as a mask. For example, the removal process includes causing the uncovered region recited above to absorb a gas including at least one selected from the group consisting of fluorine, chlorine, and, carbon. The etching is, for example, RIE (Reactive Ion Etching).

In the embodiment, the oxide 32 is formed in the pattern formation material film 50 as recited above. Therefore, the etching resistance of the pattern formation material film 50 used as the mask is improved. Thereby, good patternability is obtained in the etching (the removal process recited above) that uses the pattern formation material film 50 as a mask. Patterning with high precision can be implemented.

According to the embodiment, a pattern formation method can be provided in which it is possible to increase the productivity.

An example of experimental results relating to the pattern formation material will now be described.

The composition of a sample SP00 of the pattern formation material is as follows.

N-vinylformamide: 26 vol %
Diethylene glycol diacrylate: 45 vol %
Tricyclodecane dimethanol diacrylate: 26 vol %
2-benzyl-2-(dimethylamino)-1-(4-morpholinophenyl)-1-butanone: 3 vol %

The processing described in reference to FIG. 2A to FIG. 2E is performed using the sample SP00 (one of the pattern formation materials). The substrate 60 is a silicon wafer. The template 70 is quartz. The pattern formation material film 50 is obtained by irradiating, on the film 50F, ultraviolet light 45. The pattern formation material film 50 is exposed to TMA (the organometal compound 30); and the TMA corresponds to a precursor. Further, processing is performed in the atmosphere 62 including at least one selected from the group consisting of water, oxygen, and ozone.

The etching rate for $O_2$ RIE of the pattern formation material film 50 is evaluated. The evaluation is performed in the state prior to the absorbing with the TMA (the organometal compound 30), and in the state after the absorbing with the TMA and the processing in the atmosphere 62. The former is, for example, the etching rate (a first etching rate ER1) prior to metalizing. The latter is, for example, the etching rate (a second etching rate ER2) after metalizing.

The ratio (ER1/ER2) of the first etching rate ER1 to the second etching rate ER2 is taken as an etching rate ratio Re. A high etching rate ratio Re means that the etching resistance is improved by the process of FIG. 2D (e.g., the metalization).

In the sample SP00, the etching rate ratio Re is about 4.9. The etching resistance for this value is practically insufficient.

Other samples described below are evaluated.

FIG. 3A to FIG. 3E and FIG. 4A to FIG. 4E are schematic views illustrating the pattern formation materials.

These drawings illustrate monomers included in the pattern formation materials. For example, the monomers correspond to the first monomer 15.

As shown in FIG. 3A, PTTA (pentaerythritol triacrylate) is used as the monomer in a first sample SP01. The number of the first elements 10e having the straight chain configuration is 3 in PTTA.

As shown in FIG. 3B, GLPOTA (glycerol propoxylate (1PO/OH)triacrylate) is used as the monomer in a second sample SP02. The number of the first elements 10e having the straight chain configuration is 13 in GLPOTA.

As shown in FIG. 3C, GDD (glycerol1,3-diglycerolate diacrylate) is used as the monomer in a third sample SP03. The number of the first elements 10e having the straight chain configuration is 13 in GDD.

As shown in FIG. 3D, NDDA (1,9-nonanediol diacrylate) is used as the monomer in a fourth sample SP04. The number of the first elements 10e having the straight chain configuration is 11 in NDDA.

As shown in FIG. 3E, TPGDA (tripolyethyleneglycol diacrylate) is used as the monomer in a fifth sample SP05. The number of the first elements 10e having the straight chain configuration is 10 in TPGDA.

Figure 4A:
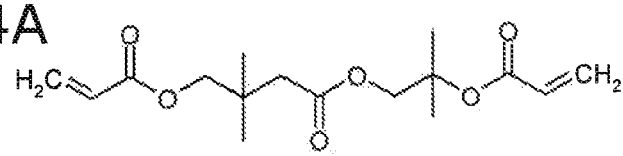
FIG. 4A to FIG. 4E are schematic views illustrating the pattern formation materials.

As shown in FIG. 4A, HPNDA (neopentylglycol hydroxypivalate diacrylate) is used as the monomer in a sixth sample SP06. The number of the first elements 10e having the straight chain configuration is 9 in PITA.

Figure 4B:
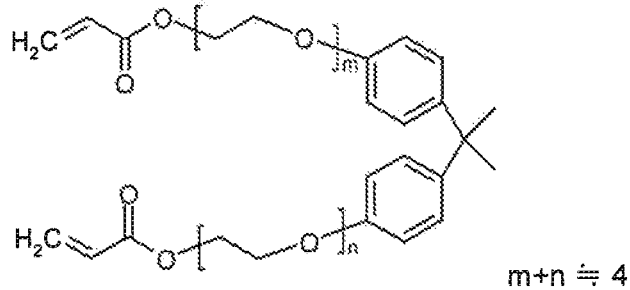

As shown in FIG. 4B, BP-4EAL (bisphenol A ethoxylate diacrylate, CAS no. 64401-02-1) is used as the monomer in a seventh sample SP07. In BP-4EAL, the number of the first elements 10e having the straight chain configuration is 15, 18, 21, 24, and 27; and the average is 24.

Figure 4C:
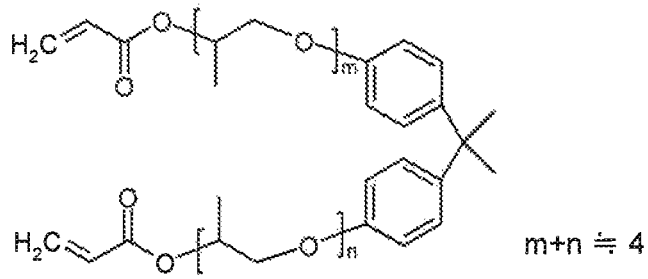

As shown in FIG. 4C, BP-4PA (bisphenol A propoxylate diacrylate, CAS no. 61722-28-9) is used as the monomer in an eighth sample SP08. In BP-4EAL, the number of the first elements 10e having the straight chain configuration is 15, 18, 21, 24, and 27; and the average is 24.

Figure 4D:
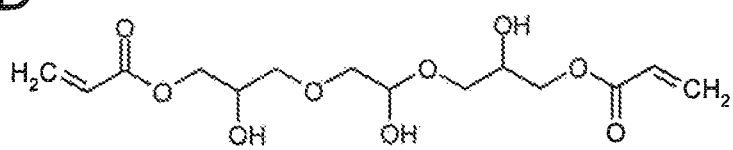

As shown in FIG. 4D, 70PA (propylene glycol diglycidyl ether diacrylate) is used as the monomer in a ninth sample SP09. The number of the first elements 10e having the straight chain configuration is 10 in 70PA.

Figure 4E:
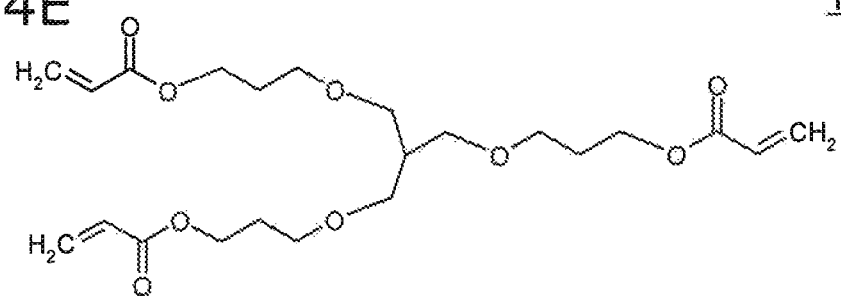

As shown in FIG. 4E, TMP3POTA (trimethylolpropane propoxylate triacrylate) is used as the monomer in a tenth sample SP10. The number of the first elements 10e having the straight chain configuration is 11 in TMP3POTA.

2-benzyl-2-(dimethylamino)-1-(4-morpholinophenyl)-1-butanone is added at 3 vol % to each of these samples. Thereby, the first to tenth samples are obtained. The first etching rate ER1 and the second etching rate ER2 are evaluated similarly to the sample SP00 recited above. The etching rate ratio Re also is derived.

Figure 5:
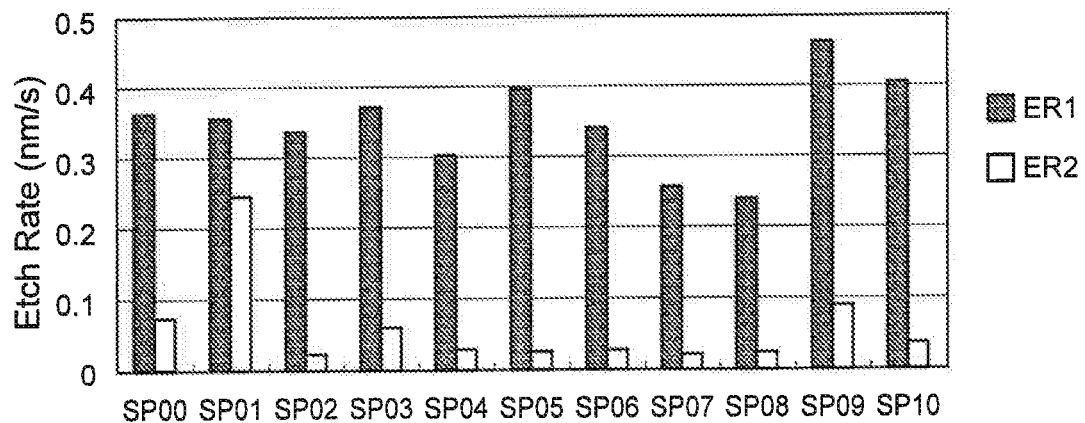
FIG. 5 is a schematic view illustrating characteristics of the pattern formation materials.
Figure 6:
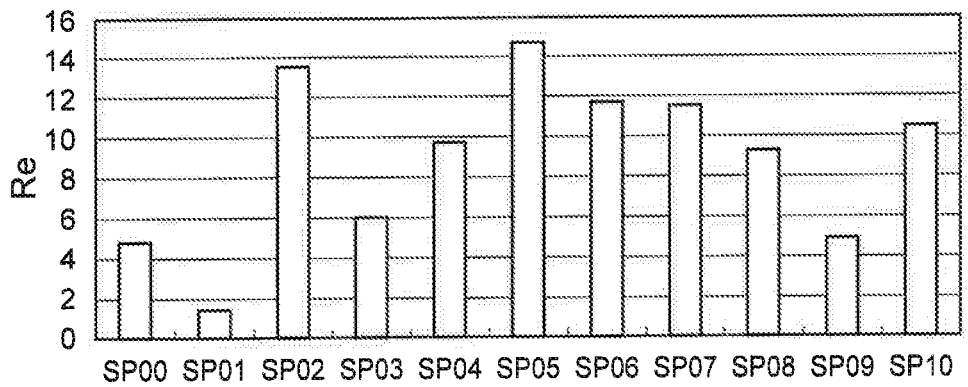
FIG. 6 is a schematic view illustrating characteristics of the pattern formation materials.

FIG. 5 and FIG. 6 are schematic views illustrating characteristics of the pattern formation materials.

The vertical axis of FIG. 5 is the etching rate (the first etching rate ER1 or the second etching rate ER2). The vertical axis of FIG. 6 is the etching rate ratio Re. The values of the sample SP00 and the first to tenth samples SP01 to SP10 are shown in these figures.

As shown in FIG. 6, for example, the etching rate ratio Re is low for the first sample SP01 (PTTA). The degree of the improvement of the etching resistance due to the metalization is small for the first sample SP01 (PITA) in which the number of the first elements 10e having the straight chain configuration is 3.

On the other hand, the etching rate ratio Re is high for the second sample SP02 (GLPOTA). The etching resistance due to the metalization is markedly improved for the second sample SP02 (GLPOTA) in which the number of the first elements 10e having the straight chain configuration is 13.

Compared to the first sample SP01 (PITA), a high etching rate ratio Re is obtained for the other samples as well.

Thus, a high etching rate ratio Re is obtained when the number of the first elements 10e having the straight chain configuration is large. In other words, the etching resistance is improved by the metalization.

Transmission electron microscope-energy dispersive X-ray spectrometry (TEM-EDX) analysis and analysis by dynamic secondary ion mass spectrometry (D-SIMS) are performed for the sample SP00. As a result, it was shown that an $AlO_x$ layer exists in the front surface of the pattern formation material film 50 for the sample SP00.

In the sample SP00, the pattern is formed by crosslinking. Therefore, it is considered that a matrix having a mesh configuration is formed in the polymer after crosslinking. Two TMAs form a dimer in normal condition. It is considered that $AlO_x$ does not occur in the inner portion of the pattern formation material film 50 if the TMA dimer cannot pass through the gap of the mesh.

Therefore, the following can be estimated about the characteristics of the diffusion of the TMA inside the crosslinked resist polymer. For example, a model is generated in which the two ends of each of two diacrylates are bonded in a ring as the crosslinked form. Structure relaxation of this model was performed using molecular mechanics (MM).

According to this estimation, the size of the opening in the sample SP00 (diethylene glycol diacrylate) is insufficient for the TMA dimer to pass through. Conversely, in GDD in which the chain length is long, an opening is obtained through which even the TMA dimer can pass through.

By using a diacrylate in which the chain length is long, it is possible for the aluminization to reach the resist interior. It is favorable for the number of the multiple first elements 10e to be 6 or more. If this number becomes excessively large, the mechanical strength of the resist may decrease because the crosslinking point density decreases. It is favorable for the number of the multiple first elements 10e to be about 30 or less. For example, the decrease of the mechanical strength of the resist can be suppressed.

The first etching rate ER1 is low for BP-4EAL and BP-4PA. It is considered that this is because a benzene ring is included inside the molecular structure for these monomers. The etching rate ratio Re is high for these monomers. For these monomers, the etching resistance is high even prior to metalizing; and the etching resistance after metalizing improves further. It is considered that this is because the diffusion of the precursor progresses smoothly in these monomers because the value (the average) of the number of the multiple first elements 10e is large and is 24.

Compared to the sample SP00 as well, the etching rate ratio Re is low for the first sample SP01 (PTTA). This is because the distance between the chemical crosslinking points is short and it is difficult for the precursor to pass through the mesh inside the polymer because the number of the multiple first elements 10e is small in the first sample SP01.

For the third sample SP03 (GDD) and the ninth sample SP09 (70PA), the etching rate ratio Re is about the same as that of the sample SP00. It is considered that this is because in GDD and 70PA, the hydroxyl groups inside the molecule form physical crosslinks due to the hydrogen bonds; and it is difficult for the diffusion of the precursor to occur.

In the case of the physical crosslinks, the etching rate ratio Re can be increased by increasing the diffusion time of the precursor. The etching rate ratio Re being low (the degree of the metalization being low) when the distance between the chemical crosslinking points is short is intrinsically different from the etching rate ratio Re being low due to the physical crosslinking.

For materials in which the number of the first elements 10e having the straight chain configuration is small, it is considered that the space formed by the molecular chains is narrow after the polymerization of the monomer. Therefore, the metallic element 31 does not penetrate easily inside the film. The etching rate inside the film does not decrease, even if the etching rate of only the front surface of the film decreases. The etching resistance inside the film substantially does not improve.

Conversely, for materials in which the number of the first elements 10e having the straight chain configuration is large, it is considered that the space formed by the molecular chains is wide after the polymerization of the monomer. Therefore, the metallic element 31 easily passes through the wide space and penetrates inside the film. Because the metallic element 31 exists not only at the front surface of the film but also at the inner portion of the film, the etching rate decreases at the inner portion of the film as well. The etching resistance of the entire film improves.

Thus, when implementing the process (e.g., the metalization) of FIG. 2D, it is considered that it is effective to set the number of the first elements 10e having the straight chain configuration of the monomer inside the pattern formation material to be large. Thereby, the etching resistance improves. The desired etching can be implemented stably. A pattern formation material and a pattern formation method can be provided in which it is possible to increase the productivity.

In the embodiment, for example, the number of the multiple first elements 10e is 6 or more. Thereby, the etching resistance improves effectively. The number may be 8 or more. The etching resistance improves more effectively. The number may be 10 or more. The etching resistance improves more effectively.

In the embodiment, the first monomer 15 includes, for example, the compositions represented by the following first to sixth chemical formulas.

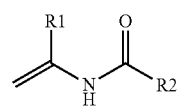

[Chemical formula 1]

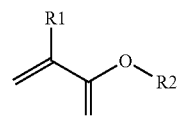

[Chemical formula 2]

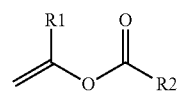

[Chemical formula 3]

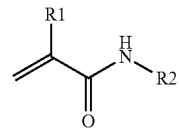

[Chemical formula 4]

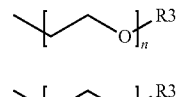

[Chemical formula 5]

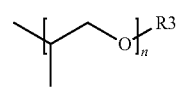

[Chemical formula 6]

"R1" in the chemical formulas recited above is hydrogen or a methyl group.

"R2" in the chemical formulas recited above is an alkyl group in which the number of carbon atoms is 1 to 20. The alkyl group may include a branch. The alkyl group may include an aliphatic cyclic compound. In "R2" recited above, a portion of the hydrogen atoms may be replaced with a hydroxyl group, a carboxyl group, a carbonyl group, fluorine, a benzene ring, etc.

"R3" in the chemical formulas recited above is one of a methyl group, a hydroxyl group, or a carboxyl group.

In the embodiment, the first monomer 15 may include, for example, at least one selected from the group consisting of glycerol propoxylate(1PO/OH)triacrylate, tripolyethyleneglycol diacrylate, neopentylglycol hydroxypivalate diacrylate, bisphenol A ethoxylate diacrylate, bisphenol A propoxylate diacrylate, and trimethylolpropane propoxylate triacrylate.

In the embodiment, the first monomer 15 may include, for example, a benzene ring. Thereby, for example, a high etching resistance is obtained prior to metalizing as well.

The pattern formation material (the pattern formation material 110 or 111) according to the embodiment may include another monomer in addition to the first monomer 15.

Figure 7:
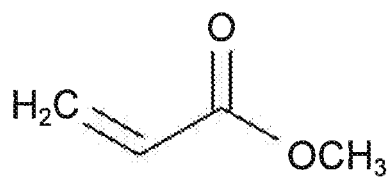
FIG. 7 is a schematic view illustrating the pattern formation material according to the embodiment.

FIG. 7 is a schematic view illustrating the pattern formation material according to the embodiment.

FIG. 7 illustrates another monomer (a second monomer). In the example, the second monomer is methylacrylate (MA). The pattern formation material (the pattern formation material 110 or 111) according to the embodiment may include the second monomer in addition to the first monomer 15 recited above. The second monomer includes acrylic.

If the number of the multiple first elements 10e in the first monomer 15 becomes large, the viscosity of the pattern formation material 110 may become high. By using the second monomer in addition to the first monomer 15, for example, the viscosity can be adjusted.

In the embodiment, the pattern formation material (the pattern formation material 110 or 111) may further include, for example, a first material including at least one of a photosensitive agent or a curing agent. The first material includes, for example, at least one selected from the group consisting of a photo-radical generator and a photoacid generator.

The concentration of the first monomer 15 inside the pattern formation material is, for example, 50 weight percent or more. The film 50F that includes the first monomer 15 is caused to absorb the metal compound 30 including the metallic element 31. For example, the metallic element 31 can be introduced to the film 50F; and a high etching resistance is obtained.

The embodiment may include the following configurations (technological proposals).

Configuration 1

A pattern formation material including a first monomer, the first monomer including a first molecular chain, a first group, and a second group, the first molecular chain including a first end and a second end, the first group having an ester bond to the first end, the second group having an ester bond to the second end, the first group being one of acrylic acid or methacrylic acid, the second group being one of acrylic acid or methacrylic acid, the first molecular chain including multiple first elements bonded in a straight chain configuration, the multiple first elements being one of carbon or oxygen, the number of the multiple first elements being 6 or more, a film including the first monomer and being caused to absorb a metal compound including a metallic element.

Configuration 2

The pattern formation material according to Configuration 1, further including a first material including at least one selected from the group consisting of a photo-radical generator and a photoacid generator.

Configuration 3

A pattern formation method, comprising:

a film formation process of forming a pattern formation material film on a substrate, the pattern formation material film including a pattern formation material; and an absorption process of causing the pattern formation material film to absorb a metal compound including a metallic element, the pattern formation material including a first monomer, the first monomer including a first molecular chain, a first group, and a second group, the first molecular chain including a first end and a second end, the first group having an ester bond to the first end, the second group having an ester bond to the second end, the first group being one of acrylic acid or methacrylic acid, the second group being one of acrylic acid or methacrylic acid, the first molecular chain including multiple first elements bonded in a straight chain configuration, the multiple first elements being one of carbon or oxygen, the number of the multiple first elements being 6 or more.

Configuration 4

The pattern formation method according to Configuration 3, wherein the first monomer further includes:

a second molecular chain including a third end and a fourth end; and a third group bonded to the third end, the third group is one of acrylic acid or methacrylic acid, and the fourth end is bonded to the first molecular chain.

Configuration 5

The pattern formation method according to Configuration 3 or 4, wherein the pattern formation material further includes a second monomer including acrylic.

Configuration 6

The pattern formation method according to any one of Configurations 3 to 5, wherein the first monomer includes at least one selected from the group consisting of glycerol propoxylate(1PO/OH)triacrylate, tripolyethyleneglycol diacrylate, neopentylglycol hydroxypivalate diacrylate, bisphenol A ethoxylate diacrylate, bisphenol A propoxylate diacrylate, and trimethylolpropane propoxylate triacrylate.

Configuration 7

The pattern formation method according to any one of Configurations 3 to 6, wherein the first monomer includes a benzene ring.

Configuration 8

The pattern formation method according to any one of Configurations 3 to 7, wherein a concentration of the first monomer inside the pattern formation material is 50 weight percent or more.

Configuration 9

The pattern formation method according to any one of Configurations 3 to 8, wherein the pattern formation material further includes a first material including at least one selected from the group consisting of a photo-radical generator and a photoacid generator.

Configuration 10

The pattern formation method according to any one of Configurations 3 to 9, wherein the film formation process includes:

positioning a film between the substrate and a surface of a template, the film including the pattern formation material, the surface having an unevenness; and curing the film, and the pattern formation material film is obtained from the film positioned at a recess of the unevenness.

Configuration 11

The pattern formation method according to Configuration 10, wherein the curing includes irradiating light on the film.

Configuration 12

The pattern formation method according to Configuration 10, wherein the curing includes heating the film.

Configuration 13

The pattern formation method according to any one of Configurations 3 to 12, wherein the absorption process includes introducing the metal compound inside the pattern formation material film.

Configuration 14

The pattern formation method according to any one of Configurations 3 to 13, wherein the absorption process includes causing the pattern formation material film to absorb at least one of a liquid including the metal compound or a gas including the metal compound.

Configuration 15

The pattern formation method according to any one of Configurations 3 to 14, further including a process of processing, after the absorption process, the pattern formation material film in an atmosphere including at least one selected from the group consisting of water, oxygen, and ozone.

Configuration 16

The pattern formation method according to Configuration 15, wherein the pattern formation material film after the process includes an oxide including the metallic element.

Configuration 17

The pattern formation method according to any one of Configurations 3 to 16, further including a removal process of removing, after the process, at least a portion of a region of the substrate not covered with the pattern formation material film.

Configuration 18

The pattern formation method according to Configuration 17, wherein the removal process includes causing the uncovered region to absorb a gas including at least one selected from the group consisting of fluorine, chlorine, and carbon.

Configuration 19

The pattern formation method according to any one of Configurations 3 to 18, wherein the metal compound includes an organic metal compound.

Configuration 20

The pattern formation method according to any one of Configurations 3 to 19, wherein the metal compound includes trimethyl aluminum.

Configuration 21

The pattern formation method according to any one of Configurations 3 to 20, wherein the metal compound includes chlorine and at least one selected from the group consisting of Ti, V, and W According to the embodiments, a pattern formation material and a pattern formation method can be provided in which it is possible to increase the productivity.

Hereinabove, embodiments of the invention are described with reference to specific examples. However, the invention is not limited to these specific examples. For example, one skilled in the art may similarly practice the invention by appropriately selecting specific configurations of components included in the pattern formation material such as the monomer, the molecular chain, the acrylic ester, etc., from known art; and such practice is within the scope of the invention to the extent that similar effects can be obtained.

Any two or more components of the specific examples also may be combined within the extent of technical feasibility and are within the scope of the invention to the extent that the spirit of the invention is included.

All pattern formation materials and pattern formation methods practicable by an appropriate design modification by one skilled in the art based on the pattern formation materials and the pattern formation methods described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method, comprising:
    a film formation process of forming, on a substrate, a pattern formation material film including a pattern formation material;
    an absorption process of causing the pattern formation material film to absorb an organometal compound including a metallic element comprising at least one selected from the group consisting Al, Ti, V and W, the absorption processing being performed after the film formation process; and
    a patterning process of patterning the pattern formation material,
    the pattern formation material including a first monomer, the first monomer including a first molecular chain, a first group, and a second group, the first molecular chain including a first end and a second end, the first group having an ester bond to the first end, the second group having an ester bond to the second end, the first group being one of acrylic acid or methacrylic acid, the second group being one of acrylic acid or methacrylic acid,
    the first molecular chain including a plurality of first elements bonded in a straight chain configuration, the first elements being one of carbon or oxygen, the number of the first elements being 6 or more.

2. The method according to claim 1, wherein
    the first monomer further includes:
        a second molecular chain including a third end and a fourth end; and
        a third group bonded to the third end,
    the third group being one of acrylic acid or methacrylic acid,
    the fourth end being bonded to the first molecular chain.

3. The method according to claim 1, wherein the pattern formation material further includes a second monomer including acrylic.

4. The method according to claim 1, wherein the first monomer includes at least one selected from the group consisting of glycerol propoxylate(1PO/OH)triacrylate, tripolyethyleneglycol diacrylate, neopentylglycol hydroxypivalate diacrylate, bisphenol A ethoxylate diacrylate, bisphenol A propoxylate diacrylate, and tri methylolpropane propoxylate triacrylate.

5. The method according to claim 1, wherein the first monomer includes a benzene ring.

6. The method according to claim 1, wherein a concentration of the first monomer inside the pattern formation material is 50 weight percent or more.

7. The method according to claim 1, wherein the pattern formation material further includes a first material including at least one selected from the group consisting of a photoradical generator and a photoacid generator.

8. The method according to claim 1, wherein
    the film formation process includes:
        positioning a film between the substrate and a surface of a template, the film including the pattern formation material, the surface having an unevenness; and
        curing the film, and
    the pattern formation material film is obtained from the film positioned at a recess of the unevenness.

9. The method according to claim 8, wherein the curing includes irradiating light on the film.

10. The method according to claim 8, wherein the curing includes heating the film.

11. The method according to claim 1, wherein the absorption process includes introducing the metal compound into the pattern formation material film.

12. The method according to claim 1, wherein the absorption process includes causing the pattern formation material film to absorb at least one of a liquid including the metal compound or a gas including the metal compound.

13. The method according to claim 1, further comprising a process of processing, after the absorption process, the pattern formation material film in an atmosphere including at least one selected from the group consisting of water, oxygen, and ozone.

14. The method according to claim 13, wherein the pattern formation material film after the process includes an oxide including the metallic element.

15. The method according to claim 1, further comprising a removal process of removing, after the process, at least a portion of a region of the substrate not covered with the pattern formation material film.

16. The method according to claim 15, wherein the removal process includes causing the uncovered region to absorb a gas including at least one selected from the group consisting of fluorine, chlorine, and carbon.

17. The method according to claim 1, wherein the metal compound includes trimethyl aluminum.

* * * * *

UNITED STATES PATENT AND TRADEMARK OFFICE
CERTIFICATE OF CORRECTION

PATENT NO. : 11,378,885 B2
APPLICATION NO. : 15/919443
DATED : July 5, 2022
INVENTOR(S) : Koji Asakawa et al.

It is certified that error appears in the above-identified patent and that said Letters Patent is hereby corrected as shown below:

In the Claims

Claim 4, Column 12, Line 49, "tri methylolpropane" should read --trimethylolpropane--.

Signed and Sealed this
Sixteenth Day of May, 2023

Katherine Kelly Vidal
*Director of the United States Patent and Trademark Office*